United States Patent
Kraus et al.

(10) Patent No.: US 6,803,732 B2
(45) Date of Patent: Oct. 12, 2004

(54) LED ARRAY AND LED MODULE WITH CHAINS OF LEDS CONNECTED IN PARALLEL

(75) Inventors: Robert Kraus, Regensburg (DE); Simon Blümel, Schierling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/324,431

(22) Filed: Dec. 20, 2002

(65) Prior Publication Data

US 2003/0116773 A1 Jun. 26, 2003

(30) Foreign Application Priority Data

Dec. 20, 2001 (DE) .......................................... 101 63 120
Dec. 6, 2002 (DE) .......................................... 102 57 184

(51) Int. Cl.$^7$ ................................................ G05F 1/00
(52) U.S. Cl. ....................... 315/307; 315/149; 315/302; 362/800
(58) Field of Search ................................ 315/149–151, 315/158–159, 291, 293, 302, 307, 308; 362/800

(56) References Cited

U.S. PATENT DOCUMENTS

| | | | | |
|---|---|---|---|---|
| 4,271,408 A | * | 6/1981 | Teshima et al. | 345/83 |
| 4,298,869 A | * | 11/1981 | Okuno | 345/82 |
| 5,138,310 A | * | 8/1992 | Hirane et al. | 345/82 |
| 5,313,187 A | * | 5/1994 | Choi et al. | 340/331 |
| 5,404,008 A | * | 4/1995 | Malinowski et al. | 250/222.1 |
| 6,078,148 A | * | 6/2000 | Hochstein | 315/291 |
| 6,153,985 A | * | 11/2000 | Grossman | 315/291 |
| 6,394,626 B1 | * | 5/2002 | McColloch | 362/251 |
| 6,583,731 B2 | * | 6/2003 | Chan et al. | 340/931 |
| 6,693,556 B1 | * | 2/2004 | Jones et al. | 340/907 |
| 2002/0140379 A1 | * | 10/2002 | Chevalier et al. | 315/291 |
| 2003/0095406 A1 | * | 5/2003 | Lebens et al. | 362/800 |

* cited by examiner

Primary Examiner—Thuy Vinh Tran
(74) Attorney, Agent, or Firm—Laurence A. Greenberg; Werner H. Stemer; Gregory L. Mayback

(57) ABSTRACT

An LED array has a plurality of LED chains, which each have at least one LED and are connected in parallel. The LED array has at least one output for feeding back radiation generated to a power supply unit. Preferably, at least one reference LED chain is connected in parallel with the LED chains and a photosensitive component is provided, the photosensitive component detecting the radiation emitted by the reference LED chain. The photosensitive component generates a measurement signal in a manner dependent on the radiation generated by the reference LED chain, which signal serves for providing feedback to the power supply unit.

42 Claims, 6 Drawing Sheets

FIG 7

LED ARRAY AND LED MODULE WITH CHAINS OF LEDS CONNECTED IN PARALLEL

BACKGROUND OF THE INVENTION

Field of the Invention

The invention relates to an LED array having a plurality of LED chains that each have at least one LED and are connected in parallel. The invention also relates to an LED module.

In operation, such LED arrays are usually connected to a current source that supplies the LED array with an operating current, the operating current and an operating voltage are fixedly prescribed.

For an LED array, a lower limit is often specified for the radiation generated, which lower limit must not be undershot. This applies particularly in the case of uses in signaling installations, such as, for example, traffic lights or rail signals. For reasons of traffic safety, particular consideration must be given here to complying with the prescribed lower limits, which generally relate to the light power.

On account of aging phenomena, the radiation yield decreases as the operating duration increases in the case of LEDs and hence in the case of LED arrays of the above-mentioned type. In order to ensure that predetermined lower limits are complied with throughout the service life of an LED array, over dimensioning of the LED array or operation with an increased operating voltage is necessary, by way of example. These measures are in each case to be dimensioned such that even in the worst-case scenario, toward the end of the service life, a sufficient light power above the predetermined lower limit is achieved. It is accepted in this case that significantly more light than would be necessary for the envisaged function of the LED array is generated at the beginning of operation. Moreover, the production costs of an LED array rise due to the over dimensioning thereof, and an increased operating voltage leads to higher operating costs and possibly to accelerated aging.

SUMMARY OF THE INVENTION

It is accordingly an object of the invention to provide a LED array and a LED module that overcome the above-mentioned disadvantages of the prior art devices of this general type, which has improved driving. In particular, it is an object of the invention to provide an LED array that has a radiation power that is as constant as possible even during long-term operation. with the foregoing and other objects in view there is provided, in accordance with the invention, an LED array. The LED array contains a plurality of LED chains each having at least one LED and connected in parallel with each other, and at least one output for feeding back radiation generated to a power supply unit.

The invention is based on the idea of providing, in the LED array, an output via which optical parameters of the LED array, such as the radiation power, for example, can be fed back to a power supply unit.

According to the invention, the LED array contains a plurality of LED chains each having at least one LED, which are connected in parallel. The LED array has at least one output for a feedback of the radiation power generated to the power supply unit.

In this case, a reference LED chain having at least one LED is preferably provided, the optical parameters of which, for example the radiation power, are detected by a photosensitive component and converted into an electrical measurement signal, which is available at the output for feedback to the power supply unit.

By the power supply unit, the operating voltage or the operating current can be set using the measurement signal such that a largely constant radiation power is achieved and, in particular, a predetermined lower limit for the radiation power is not undershot.

Overall, an optimum modulation of the LED array is thus produced.

It is advantageous that such an LED array does not have to be operated far above the minimum requirements at the beginning of operation. As a result, a lower degree of energization is produced from the start, which leads to a longer service life of the LED array. Moreover, the operation of the module is more cost-effective on account of the lower electrical power demand.

The tracking of the energization in accordance with the optical parameters such as the radiation power, for example, ensures that the optical minimum requirements are complied with throughout the service life significantly more reliably than in the case of conventional LED arrays with fixedly prescribed values for the operating voltage or the operating current.

In the case of the invention, the LEDs are preferably surface-mountable LEDs, which enable LED modules with a high packing density and a correspondingly high luminance.

In an advantageous refinement of the invention, the reference LED chain contains a series circuit of a plurality of LEDs. A reference LED chain with a plurality of LEDs has the advantage that the aging behavior of the reference LEDs as a whole comes closer to the aging behavior of the LED module than an individual LED. In particular, statistical fluctuations of the LED parameters and manufacturing tolerances of the LEDs are compensated for better in this way.

Furthermore, it is advantageous to configure the LED array such that the photosensitive component detects only the radiation generated by the reference LED chain. Different functions are thus assigned to the LED chains, on the one hand, and the reference LED chain, on the other hand. The reference LED chain serves essentially, preferably exclusively, for monitoring the optical parameters, while the other LED chains serve essentially, preferably exclusively, for radiation generation, for example for illumination or signaling purposes. This subdivision of the functions has the advantage that it is not necessary to monitor the radiation generation in all of the LED chains simultaneously, which can lead to a considerable technical outlay in the case of relatively large LED arrays. In particular, the reference LED chain together with the photosensitive component can be separated from the other LED chains, since radiation toward the outside is neither necessary nor desirable in the case of the reference LED chain. Conversely, this results in that the monitoring of the optical parameters is advantageously not corrupted by externally incident extraneous light such as solar radiation, for example. If only the radiation generated by the LED array is detected overall, then it is generally necessary to take particular precautions that prevent such corruption by extraneous light.

The separation of the reference LED chain from the other LED chains can be achieved by virtue of the fact that the LED array is provided with an encapsulation with a radiation exit opening through which is emitted only the radiation of the LED chains, but not the radiation of the reference LED chain.

A further separation possibility consists in providing a common main radiating direction for the LED chains, which main radiating direction differs from a reference radiating direction assigned to the reference LED chain. By way of example, the LED chains, and the reference LED chain, can be disposed on different sides of a printed circuit board, so that the main radiating direction and the reference radiating direction point in opposite directions.

A screen is preferably provided for separating the reference LED chain from the other LED chains, which screen covers the reference LED chain together with the photosensitive component. This prevents, in particular, the detection of the radiation generated by the reference LED chain from being corrupted by radiation from the outside. In this case it is advantageous to provide that side of the screen that faces the reference LED chain with a diffusely reflecting surface or coating. This increases the radiation component available for detection. Furthermore, the averaging over the radiation components generated by the individual LEDs and, consequently, the compensation of the above-mentioned statistical fluctuations of the LED parameters and of the manufacturing tolerances are improved.

In a preferred refinement of the invention, the LED array contains a converter circuit, which is connected to the photosensitive component and generates the measurement signal. By way of example, a photodiode, in particular a PIN photodiode, may serve as the photosensitive component. The converter circuit generates a voltage in a manner dependent on the radiation detected by the photosensitive component, an output coupler, preferably an optocoupler, being driven by the voltage on the input side. The measurement signal for feedback to the power supply unit is then present at the output-side terminals of the output coupler. In the case of an optocoupler, by way of example, the resistance between the output-side terminals or a photocurrent generated in the optocoupler can be used as the measurement signal, depending on the embodiment.

In a development of this refinement, a photodiode is connected in series with a series resistor, so that a voltage that is proportional to the photocurrent that is generated by the photodiode and is dependent on the detected radiation is dropped across the series resistor. The voltage drives the base of a transistor whose emitter is connected to a first reference potential via a zener diode and whose collector is connected to a second reference potential via a collector resistor. The second reference potential is greater, in the case of an npn transistor, and less, in the case of a pnp transistor, than the first reference potential. Furthermore, the output coupler provided is an optocoupler whose input side, for example whose input-side LED, is connected in parallel with the collector-emitter path of the transistor.

The series resistor defines a threshold value for the radiation to be detected. Below the threshold value, the transistor is in the off state and a current determined by the collector resistor and the zener diode flows through the input side of the optocoupler. The threshold value is exceeded if the photocurrent generated by the photodiode is so large that the voltage dropped across the series resistor exceeds the sum of the zener voltage and the base-emitter voltage (the latter is typically about 0.65 V). A current then flows through the collector-emitter path of the transistor, i.e. the transistor partly short-circuits the input of the optocoupler, so that the current through the optocoupler is reduced. The output resistance of the optocoupler changes correspondingly. This change in resistance serves as a measurement signal for controlling the power supply unit.

In a further advantageous refinement of the invention, a regulating configuration for regulating a predetermined current distribution between the individual LED chains and the reference LED chain is in each case connected in series with each LED chain and with the reference LED chain. This advantageously avoids the situation where the currents in the individual LED chains deviate to an excessively great extent from the predetermined desired current intensities on account of different forward voltages of the individual LEDs or a short circuit of an LED.

Preferably, the regulating configurations each contain a current amplification circuit for impressing a predetermined operating current into the LED chains in accordance with the predetermined current distribution. In this case, the current amplification circuits may have regulating inputs for regulating the respective current in the LED chain, the regulating inputs preferably being connected to one another and being at the same potential.

Within the scope of the invention, an LED module is furthermore provided which contains the LED array according to the invention and also a power supply unit. The LED array has supply terminals to which the power supply unit is connected on the output side. The power supply unit has a control input for controlling the output-side operating voltage or the output-side operating current with which the LED array is supplied. In this case, the output of the LED array, at which the measurement signal for feedback of the radiation generated is present, is connected to the control input of the power supply unit. It is advantageous that, in the case of such an LED module, by the feedback of the radiation generated to the power supply unit, operating parameters such as operating current and operating voltage can be tracked in such a way that a virtually constant optical power is achieved over the entire service life or a decrease in the radiation efficiency in the case of the LED chains, which decrease occurs with advancing aging, is compensated for.

The invention is suitable in particular for use in signaling installations such as traffic lights or rail signaling installations. In this case, it is particularly advantageous that the invention ensures a virtually constant radiation power and thus that prescribed lower limits for the radiation power are complied with for the entire service life, without the need for over dimensioning or excessively increased radiation generation at the beginning of the service life.

Other features which are considered as characteristic for the invention are set forth in the appended claims.

Although the invention is illustrated and described herein as embodied in a LED array and a LED module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a block diagram of an exemplary embodiment of an LED module 1 according to the invention that contains an LED array 2 and a power supply unit 3. The LED array 2 will be described in more detail below.

Figure 1:
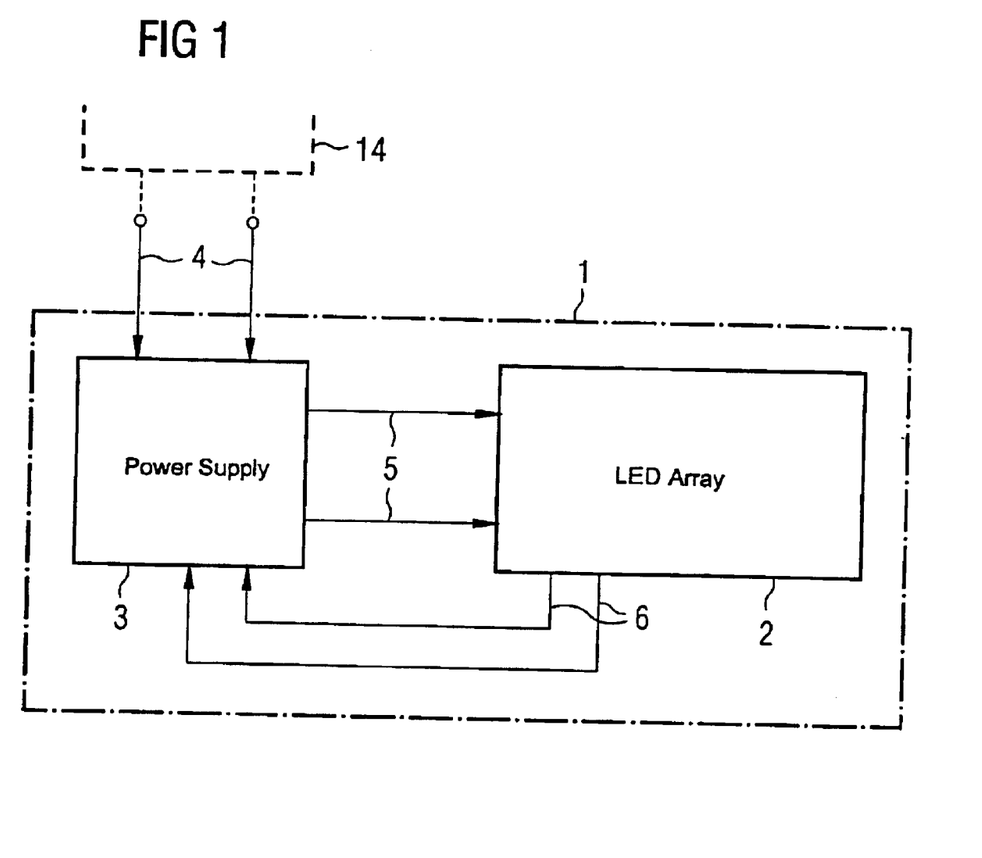
FIG. 1 is a block diagram of an exemplary embodiment of an LED module according to the invention.

Inputs 4 of the power supply unit 3 are connected to a generally available current source, for example a public power supply system 14. The power supply unit 3 converts the input voltage in such a way that a voltage that is suitable for operating the LED array 2 is available at outputs 5. This generally necessitates stepping down the voltage present on the inputs and rectifying it or smoothing the operating current.

The forward voltage of an individual LED typically lies in the range from 1 V to 5 V, so that, depending on the number of LEDs in the LED chains, a voltage of between 5 V and 30 V, that is to say in the low-voltage range, is suitable for operating the LED array 2. In this case, operating currents of up to a plurality of amperes may flow, depending on the type and number of the LEDs. This applies in particular to LED modules for signaling installations that have to be visible over a long distance even in daylight and unfavorable lighting conditions and have a correspondingly large number of LEDs.

The LED array 2 has outputs 6, via which an electrical measurement signal that depends on the radiation generated by the LED array is transmitted to the power supply unit 3. The power supply unit 3 is configured in such a way that the operating current or the operating voltage of the LED array 2 is tracked in accordance with the electrical measurement signal. A constant radiation power is thus achieved overall, which remains virtually unchanged in particular even during the aging of the LEDs and an associated reduction in the radiation efficiency. This holds true, of course, only as long as the loss of radiation efficiency can be compensated for by an increase in the operating parameters.

Figure 2:
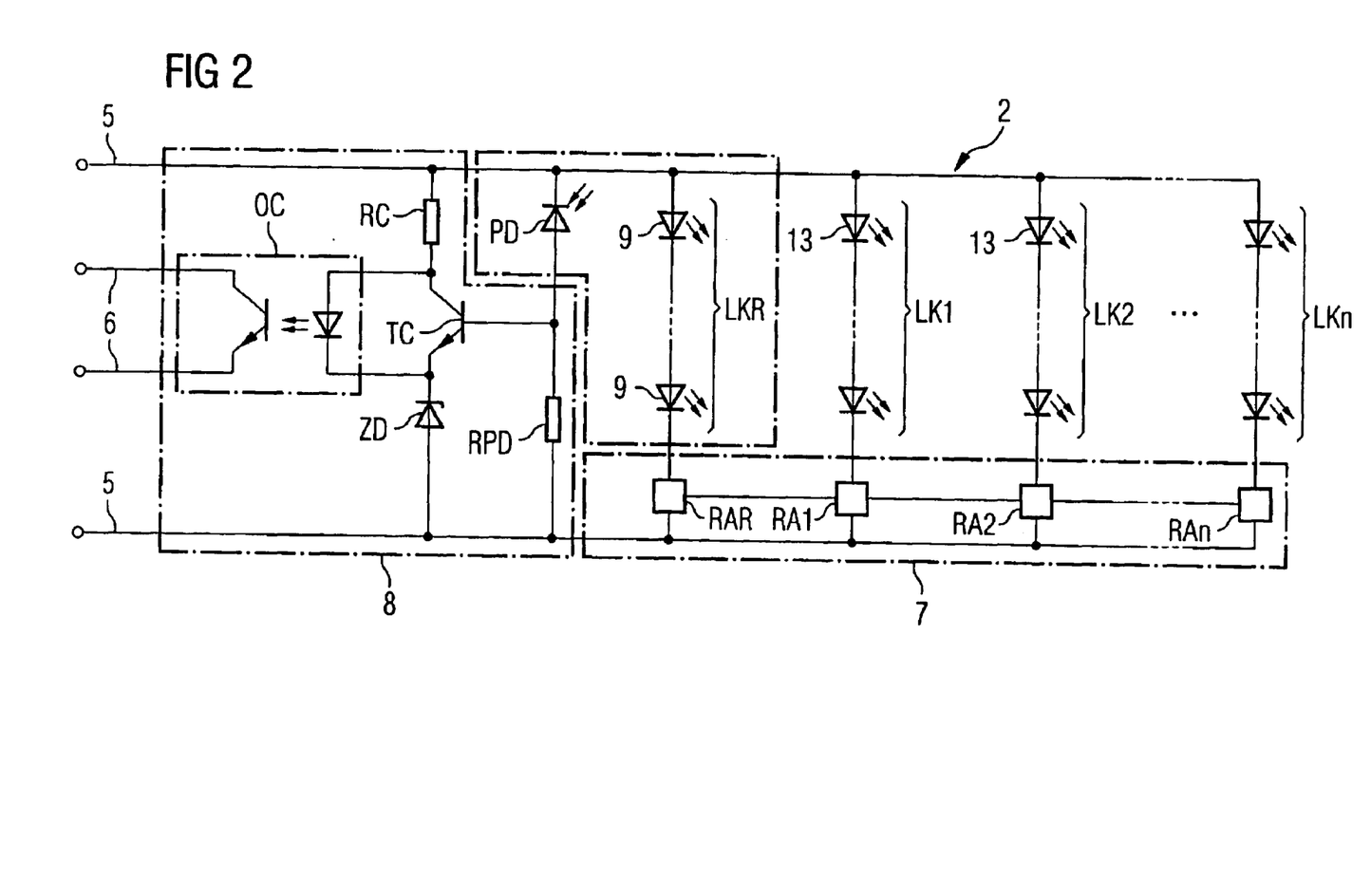
FIG. 2 is a circuit diagram of a first exemplary embodiment of an LED array according to the invention.

FIG. 2 schematically shows a circuit diagram of the LED array 2 according to the invention. The LED array 2 has a plurality of parallel-connected LED chains LK1, LK2 . . . LKn, i.e. LED series circuits.

Within the scope of the invention, a connection in parallel of the LED chains and a reference LED chain LKR is to be understood as an anodal or cathodal connection of the LED chains. In this case, it is possible, but not absolutely necessary, for the LED chains to be connected on the anode side and on the cathode side.

In the present exemplary embodiment, the LED chains LK1, LK2, . . . LKn are connected on the anode side. In order to obtain an optimum current distribution between the individual LED chains, an optional current distribution circuit 7 is provided. In this case, a regulating configuration RA1, RA2, . . . , RAn is in each case connected in series with each LED chain. The regulating configurations RAi serve for dividing the currents in the LED chains in accordance with a predetermined current distribution. The regulating configurations Rai are specifically explained in more detail in connection with the exemplary embodiments shown in FIGS. 5 to 7.

The reference LED chain LKR is disposed in parallel with the LED chains LK1, LK2, . . . LKn. The reference LED chain LKR is equipped in accordance with the other LED chains and is connected in series with a regulating configuration RAR. Using the reference LED chain LKR, by way of example, the radiation generation of the other LED chains is monitored by a photosensitive component in the form of a photodiode PD, preferably a PIN photodiode.

The use of a separate reference LED chain LKR for monitoring the radiation generation has the advantage that the reference LED chain LKR, which, in contrast to the rest of the LED chains LK1, LK2, . . . LKn does not serve for the common radiation generation or illumination purposes, together with the photodiode PD can be separated from the rest of the LED chains and a disturbance, for example due to extraneous light, can thus be efficiently suppressed. In the case of the direct detection of the total radiation generated by the LED array, particular precautions would have to be taken for this purpose, which can impair the radiation characteristic of the LED array.

In the case of the invention, the reference LED chain LKR and at least one of the LED chains have LEDs of the same type which, in particular, originate from the same manufacturing batch. This ensures that the LEDs of the reference LED chain exhibit a similar aging behavior to the rest of the LEDs, so that an aging-dictated reduction in the radiation power in the case of the reference LED chain is also significant for a corresponding aging of the rest of the LED chains LK1, LK2, . . . LKn.

By a converter circuit 8, containing a resistor RPD, a transistor TC with a collector resistor RC, and a zener diode ZD in the emitter path and also an output coupler in the form of an optocoupler OC, the radiation detected by a photodiode PD is converted into an electrical measurement signal which is present at the output 6 of the LED array 2.

To that end, the photodiode PD is connected in series with the resistor RPD, across which is dropped a voltage which is proportional to the photocurrent generated by the photodiode PD and thus depends on the radiation power of the reference LED chain LKR.

On the anode side, the photodiode PD is connected to the base of the transistor TC, so that the voltage dropped across the resistor RPD is equal to a base voltage of the transistor TC. An input-side LED of the optocoupler OC is connected in parallel with the collector-emitter path of the transistor.

In this case, the resistor RPD defines a threshold value for the radiation power of the reference LED chain LKR. The threshold value is determined by a photocurrent that causes a voltage that is equal to the sum of the zener voltage of the zener diode ZD and the base-emitter voltage of the activated transistor TC, typically 0.65 V, to be dropped across the resistor.

If the radiation power is less than the threshold value, then a voltage which is less than the above-mentioned sum is dropped across the resistor, and the transistor is in the off state. A current prescribed by the zener diode ZD and the collector resistor RC then flows through the input-side LED of the optocoupler OC, resulting in a corresponding collector-emitter resistance of an output-side phototransistor. The collector-emitter resistance serves as an electrical measurement signal, which is fed back via the outputs 6 to the power supply unit.

If the optical power of the reference LED chain LKR rises above the threshold value, then the transistor opens and at least partly short-circuits the input-side LED of the optocoupler OC. As a result, the operating current flowing through the input-side LED falls and the collector-emitter resistance of the output-side phototransistor rises. The change in resistance is transmitted via the outputs 6 to the power supply unit, which reacts thereto by reducing the operating current.

If, in the opposite case, the optical power of the reference LED chain LKR falls and the radiation incident on the photodiode PD thus falls, then the transistor TC turns off and more current is taken away via the optocoupler OC, which leads to a reduction in the collector-emitter resistance of the output-side phototransistor in the optocoupler. The reduction in resistance brings about an increase in the operating current at the power supply unit.

Figure 3:
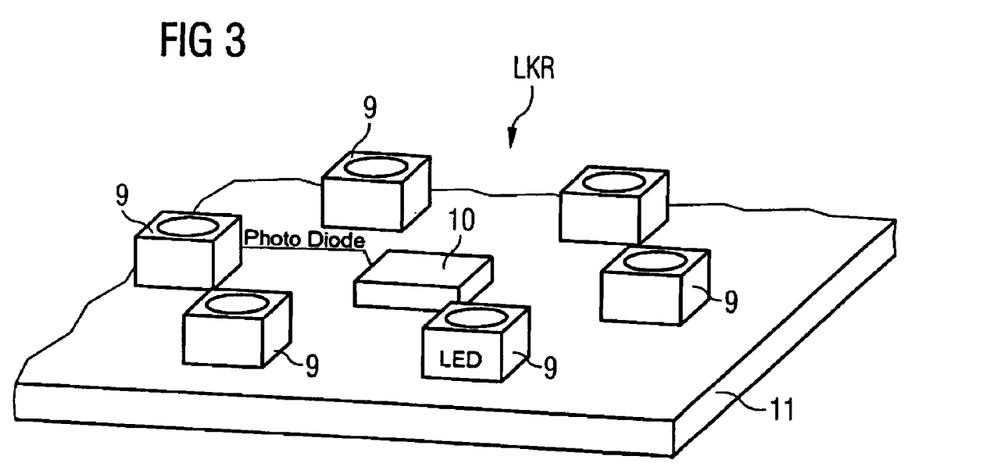
FIG. 3 is a perspective view of a second exemplary embodiment of the LED array according to the invention.

FIG. 3 diagrammatically shows an exemplary spatial configuration of LEDs 9 of the reference LED chain LKR and of a photosensitive device in the case of a second exemplary embodiment of the LED array 2 according to the invention. The LEDs 9 of the reference LED chain LKR, preferably surface-mountable LEDs, and a photosensitive device 10, for example a photodiode, are mounted onto a common printed circuit board 11.

The LEDs 9 are disposed around the photosensitive device 10, so that the radiation generated by the LEDs 9 of the reference LED chain LKR is detected reliably and reproducibly by the photosensitive component 10. It goes without saying that the photosensitive component 10 can also be positioned at a different location which lies in the light cone of at least one reference LED.

Figure 4:
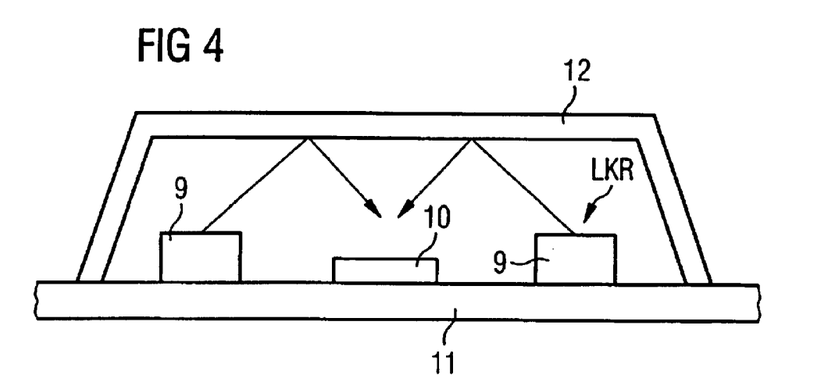
FIG. 4 is a diagrammatic, sectional view of a third exemplary embodiment of the LED array according to the invention.

A further exemplary embodiment of the LED array 2 according to the invention is illustrated in section in FIG. 4. In an extension of the exemplary embodiment shown in FIG. 3, the LEDs 9 of the reference LED chain LKR together with the photosensitive component PD are covered or encapsulated with a common screen 12, which protects the photosensitive component against extraneous light irradiation, for example, by sunlight. This prevents the measurement signal from being corrupted by extraneous light.

The screen 12 preferably has a diffusely reflecting surface or coating on a side facing the LEDs 9. This increases the radiation incident on the photosensitive device PD and, consequently, the optical efficiency and the accuracy during the feedback to the power supply unit.

Figure 5:
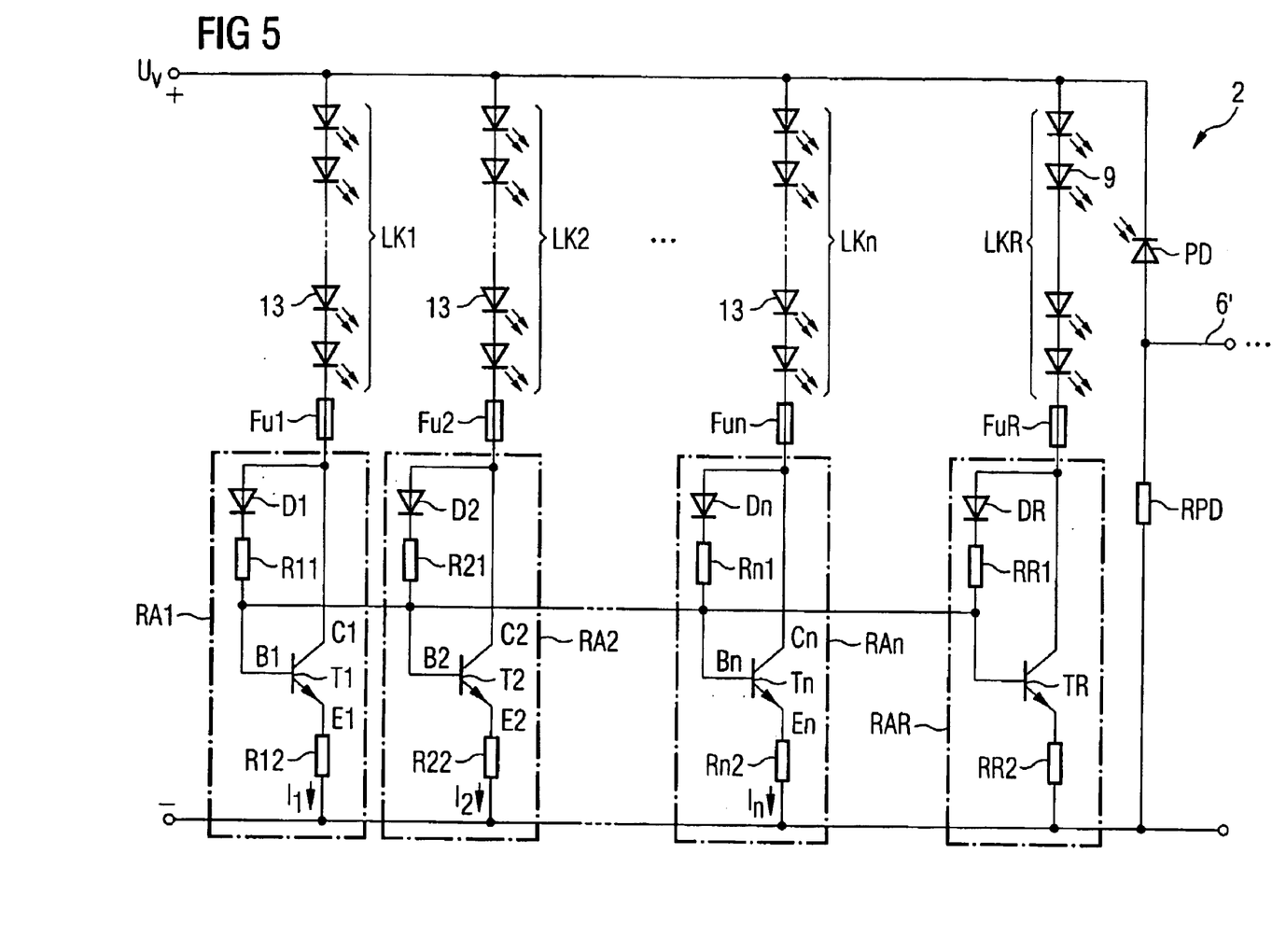
FIG. 5 is a circuit diagram of a fourth exemplary embodiment of the LED array according to the invention.
Figure 6:
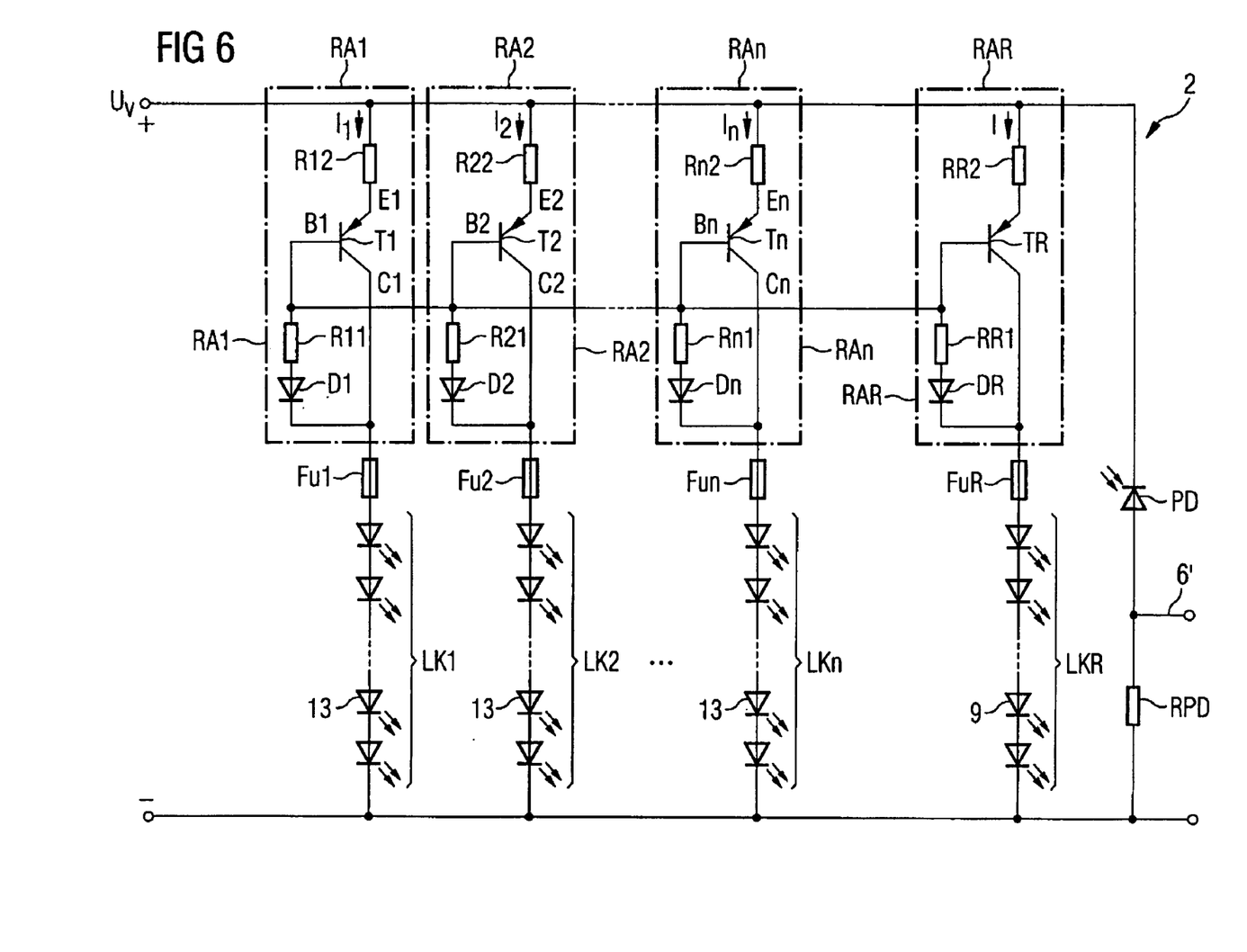
FIG. 6 is a circuit diagram of a fifth exemplary embodiment of the LED array according to the invention.
Figure 7:
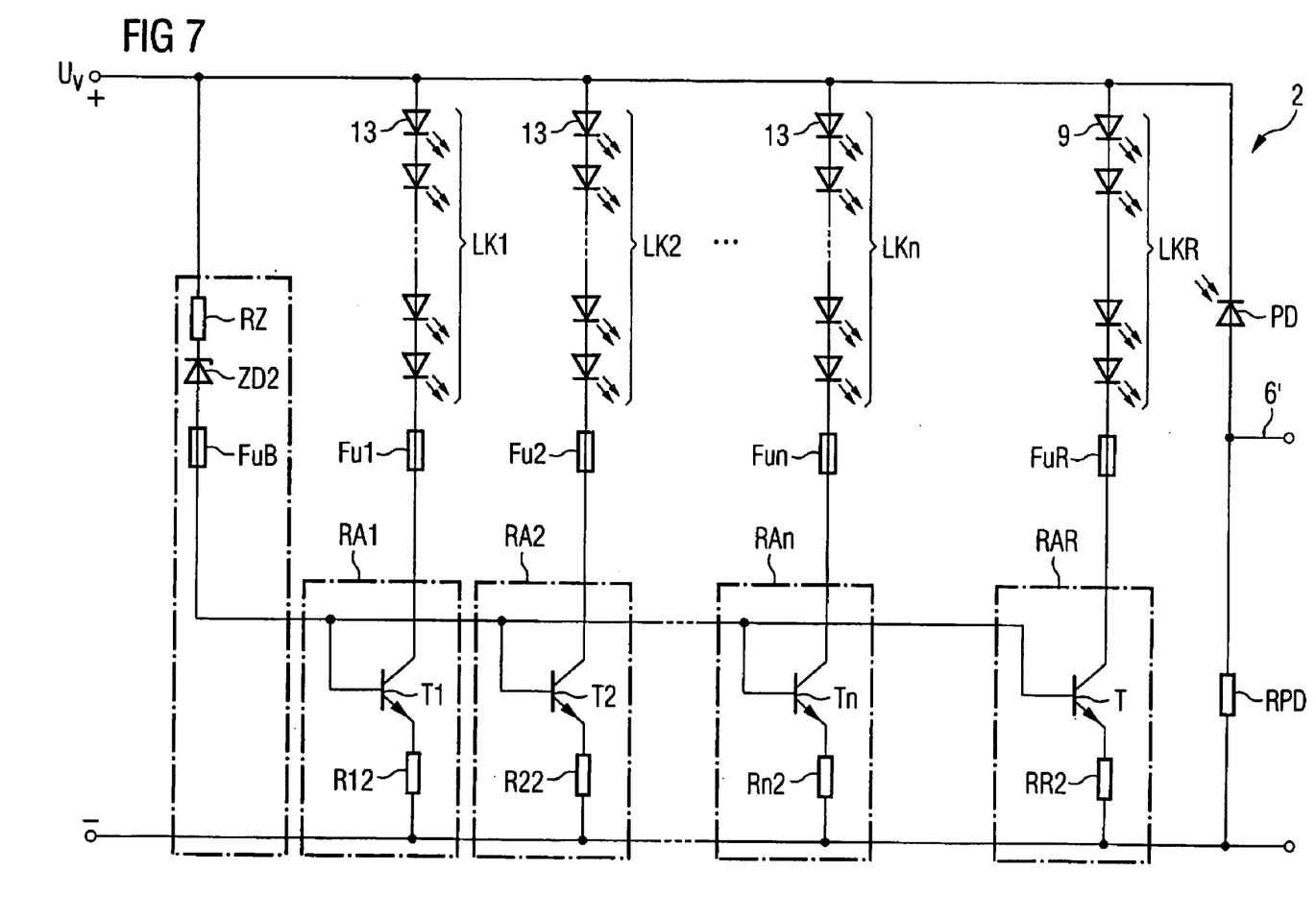
FIG. 7 is a circuit diagram of a sixth exemplary embodiment of the LED array according to the invention.

The exemplary embodiments of the LED arrays according to the invention that are illustrated in FIGS. 5, 6 and 7 relate, in particular, to the current distribution circuit 7 which has already been illustrated schematically in FIG. 2. This is a circuit configuration for dividing a total current between the individual parallel-connected LED chains LK1, LK2, . . . LKn of the LED array 2.

When LED chains are connected in parallel, even small differences in the forward voltages in the individual LEDs or small changes in the forward voltages on account of the steep U/I characteristic curve of LEDs can bring about a great change in current in the LED chains, which can lead to a great deviation of the current intensity from a predetermined desired value in the individual LED chains.

In order to counteract that, resistors connected in series with the LED chains are often provided in the case of conventional parallel circuits of LED chains. The resistors lead to an overall flatter U/I characteristic curve of the LED chains, thereby achieving a certain limitation of the current in the individual LED chains. However, rising requirements made of the accuracy of the current distribution between the individual LED chains are also accompanied by an increase in the resistances or the voltages which are dropped across the resistances and which are then typically approximately of the order of magnitude of the voltage dropped across the LEDs. This leads to a significant deterioration in the optical efficiency of the overall system and, consequently, to uneconomical operation in terms of energy.

A very fine grouping of the LEDs with regard to the forward voltages is possible as an alternative solution to the problem outlined above. However, this entails additional costs since corresponding logistics and stock keeping are necessary for the LEDs. Furthermore, the forward voltage of an LED is temperature-dependent, and it is also possible for various temperature dependencies to occur in the case of different LEDs, so that the above-mentioned grouping only partly solves the problem outlined in the case of a change in temperature.

An extreme alteration of the forward voltage in an LED chain can also be caused by a short circuit occurring in an LED or an LED leading to an interruption of the LED chain, the LED "fuses", for example. In the case of a current setting by series-connected resistors, this generally leads to a major redistribution of the currents in the LED chains.

It is desirable, therefore, for a current division that is provided for the LED array to be maintained as far as possible even in the event of an alteration of the forward voltages in the individual chains.

In the case of the exemplary embodiment shown in FIG. 5, this problem is solved by the regulating configurations RA1, RA2, . . . RAn being connected in series with each LED chain LK1, LK2, . . . LKn. The regulating configurations RA1, RA2, . . . RAn each contain a current amplification circuit which sets the current through the individual LED chains LK1, LK2, . . . LKn.

In the case of such a circuit configuration, it is advantageous that the current intensity is essentially constant and fluctuates only in the order of magnitude of a few mA. It is advantageous that even a significant alteration of the forward voltage in an LED chain, for example on account of a short circuit of an LED, does not lead to the collapse of the current division. A costly grouping of the LEDs according to forward voltage is thus obviated. In each case only a comparatively small voltage is dropped across the regulating configurations, which leads to an advantageous overall system in terms of energy principally in the case of relatively long LED chains.

Specifically, in the case of the exemplary embodiment shown in FIG. 5, a plurality of LED chains LK1, LK2, . . . LKn each having a plurality of LEDs 13 are connected in parallel by an anodal connection. Each LED chain is connected to a regulating configuration RA1, RA2, . . . RAn in series via an optional fuse Fu1, Fu2, . . . Fun, which may be embodied as a fusible resistor, for example.

The regulating configuration each contain an npn transistor T1, T2, . . . Tn, whose collector terminal C1, C2, . . . Cn is connected to the cathode side of the associated LED chain or the optionally interposed fuse Fu1, Fu2, . . . Fun, and whose emitter terminal E1, E2, . . . En is connected to a negative pole of a supply voltage $U_v$ via a respective emitter resistor R12, R22, . . . Rn2.

A series circuit containing a diode D1, D2, . . . Dn and a resistor R11, R21, . . . Rn1 is connected between the cathode side of each LED chain LK1, LK2, . . . LKn or the optional fuse Fu1, Fu2, . . . Fun and a respective base terminal of the associated transistor T1, T2, . . . Tn. The base terminals B1, B2, ... Bn of the transistors T1, T2, .... Tn are interconnected.

During operation, given an emitter current I1, I2, ... In, a voltage Rx2*Ix, x=1, 2 ... n, is dropped across the emitter resistors R12, R22, ... Rn2. A voltage drop of about 0.65 V occurs at the base-emitter junctions of the transistors T1, T2, ... Tn, so that in total the transistor bases are each at a potential Rx2*Ix+0.65 V, x=1, 2 ... n above the negative supply voltage. Since the transistor bases are electrically interconnected, the current through the different emitter resistors R12, R22, ... Rn2 is distributed via the transistors T1, T2, ... Tn in such a way that the respective potential difference between the transistor bases and the negative supply voltage is identical in the case of the regulating configurations RA1, RA2 ... RAn.

The base currents are generally negligible compared with the emitter currents, i.e. the emitter currents are approximately equal to the collector currents so that the described setting of the emitter currents at the same time defines the collector current or the current in the associated LED chain. Overall, the currents in the LED chains are thus defined by the emitter resistors R12, R22, Rn2, the currents in each case being inversely proportional to the emitter resistors.

If a total current is to be divided uniformly between the different chains, then all the emitter resistors must have the same resistance. However, a different energization of the LED chains that deviates from that can also be realized without a special outlay, through different values of the emitter resistors.

The base inputs of the transistors T1, T2, ... Tn are supplied in each case via the diodes D1, D2, ... Dn and the resistors R11, R21, ... Rn1. In this case, the diodes Dx are accorded a dual function: the diodes ensure stable operating conditions for the transistors, and they suppress shunt currents between the individual LED chains. Otherwise, potential differences in the individual LED chains, which may be caused for example by different forward voltages in the LED chains, for instance also owing to a short-circuited LED, could cause a current to flow from one LED chain into another LED chain via the common connection of the transistor bases B1, B2, ... Bn.

In this case, such a large voltage must be dropped across the diodes D1, D2, ... Dn that the transistors attain a stable operating state. LEDs can also be used as the diodes D1, D2, ... Dn, which LEDs can than additionally serve as an indicator of different forward voltages in the individual chains.

The resistors R11, R21, ... Rn1 in the respective collector-base connections need not necessarily have the same value. For optimum reliability and symmetry of the configuration, however, it is advantageous to provide identical resistors R11, R21, ... Rn1.

In the case of the circuit shown, it is advantageous that the currents for the base inputs B1, B2 ... Bn of the transistors T1, T2 ... Tn are branched off directly from the currents in the associated LED chains LK1, LK2, ... LKn via the diodes D1, D2, ... D2n and the resistors R11, R2, ... Rn1. This ensures a high stability of the circuit with respect to production-dictated fluctuations in the current gain factors, i.e. the ratio of collector current to base current of the transistors. The LED chain with the highest forward voltage determines the operating point of the circuit, a stable operating state being ensured for each transistor T1, T2, ... Tn.

A partial current is advantageously branched off from each LED chain for control purposes, thereby increasing the reliability of the system. When using emitter resistors with a tolerance of 1% the result is a base current fluctuation of only 2% and hence a current distribution with high accuracy.

The fuses Fu1, Fu2, ... Fun connected in series with the LED chains in the exemplary embodiment shown are optional and advantageous particularly in applications with increased safety requirements. The fuses are preferably embodied as fusible resistors.

If an excessively high current, for example twice the desired current, flows through an LED chain on account of a disturbance, the corresponding fuse blows and thus switches off the LED chain reliably and in a defined manner. The currents are furthermore divided between the remaining intact LED chains in accordance with the prescribed current distribution.

In this case, additional currents flow via the resistors R11, R21, ... Rn1 of the still intact LED chains, in order to maintain the required voltage drop across the emitter resistor of the defective LED chain. These additional currents bring about an increased total voltage drop across the LED array, which can be identified and correspondingly evaluated by a drive or power supply unit.

In the same way as the rest of the LED chains, the reference LED chain LKR is connected in series with an optional fusible resistor FuR and a regulating configuration RAR, containing a transistor TR with an emitter resistor RR2 and a collector-base connection with a resistor RR1 and a diode DR. As described previously, the reference LED chain is also correspondingly energized according to the emitter resistor RR2, so that the reference LED chain does not differ from the rest of the LED chains with regard to the current division.

For the feedback of the radiation power, the photodiode PD is provided as a photosensitive component, as in the case of the exemplary embodiments described above. By the series-connected resistor RPD, the photocurrent generated by the photodiode PD is converted into a voltage which is present at the output 6' and can be used as an electrical measurement signal for the feedback to the power supply unit. Preferably, the output 6' is also followed by the converter circuit 8 shown in FIG. 2 (apart from the resistor RPD already present).

FIG. 6 shows a further exemplary embodiment of the invention. In contrast to the exemplary embodiment illustrated in FIG. 6, in this case the LED chains LK1, LK2, ... LKn are connected on the cathode side and, on the anode side, are connected in series with a regulating configuration RA1, RA2 ... RAn in each case via the optional fuse Fu1, Fu2, ... Fun. The regulating configurations are correspondingly constructed with pnp transistors. The method of operation corresponds to the previous exemplary embodiment. The reference LED chain is likewise connected like the rest of the LED chains so that in this regard, too, the method of operation does not change relative to the previous exemplary embodiment.

The exemplary embodiment shown in FIG. 7 differs from the exemplary embodiment illustrated in FIG. 5, in that, instead of the respective connection between the collector Cx and the emitter Ex, x=1 ... n,R, a common drive circuit is provided which contains a zener diode ZD2 and a series resistor RZ.

A fuse FuB may optionally be provided. In the event of an interruption in an LED chain, an increased current for maintaining the voltage drop across the emitter resistor of the interrupted LED chain flows via the drive circuit. If more than a predetermined number of LED chains are interrupted or the current through the drive circuit exceeds a predetermined limit, the fuse FuB switches off the LED array in a defined manner. This may be advantageous particularly in applications with increased safety requirements.

The variant shown in FIG. 7 is distinguished by a lower outlay on circuitry compared with the variants illustrated in FIGS. 5 and 6, but requires a higher voltage drop across the regulating configuration RA1, RA2, . . . RAn, RAR, so that the efficiency is somewhat lower. Moreover, the common driving leads to a somewhat reduced stability. The variant with a common drive circuit shown in FIG. 7 can also be used correspondingly in the exemplary embodiment shown in FIG. 6.

The explanation of the invention using the exemplary embodiments does not, of course, constitute a restriction of the invention thereto. Rather, individual elements or partial aspects of the exemplary embodiments can also be combined within the scope of the invention.

We claim:

1. An LED array, comprising:
    a plurality of LED chains each having at least one LED and connected in parallel with each other; and
    at least one output for feeding back radiation generated to a power supply unit;
    at least one reference LED chain connected in parallel with said LED chains;
    a photosensitive component for detecting radiation emitted by said reference LED chain, said photosensitive component generating a signal in dependence on a radiation emitted by said reference LED chain for assisting in generating a measurement signal available at said output;
    a converter circuit directly connected to said photosensitive component and receiving the signal, said convener circuit generating the measurement signal in dependence on the signal; and
    said LED chains having a common main radiating direction and said reference LED chain having a reference radiating direction, said common main radiating direction being different from said reference radiating direction.

2. The LED array according to claim 1, wherein said photosensitive component detects only the radiation emitted by said reference LED chain.

3. The LED array according to claim 1, further comprising an encapsulation with a radiation exit opening formed therein, only the radiation generated by said LED chains being emitted through said radiation exit opening.

4. The LED array according to claim 1, further comprising regulating configurations with a respective one of said regulating configurations connected in series with a respective one of said LED chains or with said reference LED chain, said regulating configurations serving for setting currents in said LED chains and in said reference LED chain in accordance with a predetermined current distribution.

5. The LED array according to claim 4, wherein said regulating configurations contain current amplification circuits for impressing a current into said LED chains and said reference LED chain, respectively, in accordance with the predetermined current distribution.

6. The LED array according to claim 5, wherein each of said current amplification circuit has a regulating input for regulating the current in an associated one of said LED chains and said reference LED chain, said regulating input of each of said current amplification circuits are connected to one another.

7. The LED array according to claim 1, wherein the LED array serves for generating a light signal in a traffic signal.

8. The LED array according to claim 7, wherein the traffic signal is for a traffic light or a rail signal.

9. An LED module, comprising:
    a power supply unit; and
    an LED array according to claim 1 with said at least one output connected to said power supply unit for feeding back radiation generated to said power supply unit.

10. The LED module according to claim 9, wherein:
    said power supply unit has output terminals;
    said LED array has supply terminals connected to said output terminals of said power supply unit and said LED array generates a measurement signal; and
    said power supply unit has a control input for controlling an output-terminal operating voltage for said LED array, said control input receiving the measurement signal.

11. The LED module according to claim 10, wherein the output-terminal operating voltage is regulated using the measurement signal in such a way that the radiation generated by said LED chains is approximately constant.

12. The LED module according to claim 11, wherein a decrease in radiation efficiency in said LED chains, which decrease occurs with advancing aging, is compensated for by regulating the output-terminal operating voltage.

13. The LED module according to claim 9, wherein:
    said power supply unit has output terminals;
    said LED array has Supply terminals connected to said output terminals of said power supply unit and generates a measurement signal; and
    said power supply unit has a control input for controlling an output-terminal operating current for said LED array, said control input receiving the measurement signal.

14. The LED module according to claim 13, wherein the output-terminal operating current is regulated using the measurement signal in such a way that the radiation generated by said LED chains is approximately constant.

15. The LED module according to claim 14, wherein a decrease in radiation efficiency in said LED chains, which decrease occurs with advancing aging, is compensated for by regulating the output-terminal operating current.

16. The LED module according to claim 9, wherein the LED module serves for generating a light signal for a traffic signal.

17. The LED module according to claim 16, wherein the traffic signal is part of a traffic light or a rail signal.

18. An LED array, comprising:
    a plurality of LED chains each having at least one LED and connected in parallel with each other; and
    at least one output for feeding back radiation generated to a power supply unit;
    at least one reference LED chain connected in parallel with said LED chains;
    a photosensitive component for detecting radiation emitted by said reference LED chain, said photosensitive component generating a signal in dependence on a radiation emitted by said reference LED chain for assisting in generating a measurement signal available at said output;
    a converter circuit directly connected to said photosensitive component and receiving the signal, said converter circuit generating the measurement signal in dependence on the signal; and
    a screen covering only said reference LED chain and said photosensitive component.

19. The LED array according to claim 18, wherein said screen has a side with a diffusely reflecting surface, said side facing said reference LED chain.

20. The LED array according to claim 18, wherein said photosensitive component detects only the radiation emitted by said reference LED chain.

21. The LED array according to claim 18, further comprising an encapsulation with a radiation exit opening formed therein, only the radiation generated by said LED chains being emitted through said radiation exit opening.

22. An LED module, comprising:
a power supply unit; and
an LED array according to claim 18 with said at least one output connected to said power supply unit for feeding back radiation generated to said power supply unit.

23. The LED module according to claim 22, wherein:
said power supply unit has output terminals;
said LED array has supply terminals connected to said output terminals of said power supply unit and said LED array generates a measurement signal; and
said power supply unit has a control input for controlling an output-terminal operating voltage for said LED array, said control input receiving the measurement signal.

24. The LED module according to claim 23, wherein the output-terminal operating voltage is regulated using the measurement signal in such a way that the radiation generated by said LED chains is approximately constant.

25. The LED module according to claim 24, wherein a decrease in radiation efficiency in said LED chains, which decrease occurs with advancing aging, is compensated for by regulating the output-terminal operating voltage.

26. The LED module according to claim 22, wherein:
said power supply unit has output terminals;
said LED array has supply terminals connected to said output terminals of said power supply unit and generates a measurement signal; and
said power supply unit has a control input for controlling an output-terminal operating current for said LED array, said control input receiving the measurement signal.

27. The LED module according to claim 26, wherein the output-terminal operating current is regulated using the measurement signal in such a way that the radiation generated by said LED chains is approximately constant.

28. The LED module according to claim 27, wherein a decrease in radiation efficiency in said LED chains, which decrease occurs with advancing aging, is compensated for by regulating the output-terminal operating current.

29. The LED module according to claim 22, wherein the LED module serves for generating a light signal for a traffic signal.

30. The LED module according to claim 29, wherein the traffic signal is part of a traffic light or a rail signal.

31. An LED array, comprising:
a plurality of LED chains each having at least one LED and connected in parallel with each other; and
at least one Output for feeding back radiation generated to a power supply unit;
at least one reference LED chain connected in parallel with said LED chains;
a photosensitive component for detecting radiation emitted by said reference LED chain, said photosensitive component generating a signal in dependence on a radiation emitted by said reference LED chain for assisting in generating a measurement signal available at said output;
a converter circuit directly connected to said photosensitive component and receiving the signal, said converter circuit generating the measurement signal in dependence on the signal;
wherein said converter circuit has an output coupler with an input and an output, said converter circuit generating a voltage in a manner dependent on the radiation detected by said photosensitive component with which said input of said output coupler is driven, and said output of said output coupler is connected to said output for feeding back radiation generated to the power supply unit.

32. The LED array according to claim 31, wherein:
said photosensitive component is a photodiode having an anode side and a cathode side;
said converter circuit has a resistor connected in series with said photodiode;
said converter circuit further has a transistor with a base, an emitter and a collector, a zener diode connected to said emitter, and a collector resistor connected to said collector, said base connected to one of said anode side and said cathode side of said photodiode;
said input of said output coupler connected to said collector and said emitter of said transistor.

33. The LED array according to claim 31, wherein said output coupler is an optocoupler.

34. An LED module, comprising:
a power supply unit; and
an LED array according to claim 31 with said at least one output connected to said power supply unit for feeding back radiation generated to said power supply unit.

35. The LED module according to claim 34, wherein:
said power supply unit has output terminals;
said LED array has supply terminals connected to said output terminals of said power supply unit and said LED array generates a measurement signal; and
said power supply unit has a control input for controlling an output-terminal operating voltage for said LED array, said control input receiving the measurement signal.

36. The LED module according to claim 35, wherein the output-terminal operating voltage is regulated using the measurement signal in such a way that the radiation generated by said LED chains is approximately constant.

37. The LED module according to claim 36, wherein a decrease in radiation efficiency in said LED chains, which decrease occurs with advancing aging, is compensated for by regulating the output-terminal operating voltage.

38. The LED module according to claim 34, wherein:
said power supply unit has output terminals;
said LED array has supply terminals connected to said output terminals of said power supply unit and generates a measurement signal; and
said power supply unit has a control input for controlling an output-terminal operating current for said LED array, said control input receiving the measurement signal.

39. The LED module according to claim 38, wherein the output-terminal operating current is regulated using the measurement signal in such a way that the radiation generated by said LED chains is approximately constant.

40. The LED module according to claim 39, wherein a decrease in radiation efficiency in said LED chains, which decrease occurs with advancing aging, is compensated for by regulating the output-terminal operating current.

41. The LED module according to claim 34, wherein the LED module serves for generating a light signal for a traffic signal.

42. The LED module according to claim 41, wherein the traffic signal is part of a traffic light or a rail signal.

* * * * *

UNITED STATES PATENT AND TRADEMARK OFFICE
CERTIFICATE OF CORRECTION

PATENT NO. : 6,803,732 B2
DATED : October 12, 2004
INVENTOR(S) : Robert Kraus et al.

It is certified that error appears in the above-identified patent and that said Letters Patent is hereby corrected as shown below:

Column 11,
Line 33, should read as follows:
-- tive component and receiving signal, said converter --

Signed and Sealed this

Twenty-second Day of February, 2005

JON W. DUDAS
*Director of the United States Patent and Trademark Office*